(12) United States Patent
Zhang et al.

(10) Patent No.: US 8,968,491 B2
(45) Date of Patent: Mar. 3, 2015

(54) SPUTTERING TARGET AND METHOD FOR PRODUCING SAME

(75) Inventors: Shoubin Zhang, Sanda (JP); Masahiro Shoji, Sanda (JP); Yoshinori Shirai, Sanda (JP)

(73) Assignee: Mitsubishi Materials Corporation, Tokyo (JP)

( * ) Notice: Subject to any disclaimer, the term of this patent is extended or adjusted under 35 U.S.C. 154(b) by 257 days.

(21) Appl. No.: 13/579,223

(22) PCT Filed: Mar. 8, 2011

(86) PCT No.: PCT/JP2011/001352
§ 371 (c)(1),
(2), (4) Date: Aug. 15, 2012

(87) PCT Pub. No.: WO2011/114657
PCT Pub. Date: Sep. 22, 2011

(65) Prior Publication Data
US 2013/0001078 A1  Jan. 3, 2013

(30) Foreign Application Priority Data

Mar. 18, 2010 (JP) .................. 2010-063214
Feb. 23, 2011 (JP) .................. 2011-036656

(51) Int. Cl.
| | |
|---|---|
| C22C 9/00 | (2006.01) |
| C23C 14/14 | (2006.01) |
| C22C 1/10 | (2006.01) |
| C22C 32/00 | (2006.01) |
| C23C 14/34 | (2006.01) |
| C23C 14/35 | (2006.01) |
| H01L 31/032 | (2006.01) |
| B22F 3/14 | (2006.01) |

(52) U.S. Cl.
CPC . *C23C 14/14* (2013.01); *C22C 1/10* (2013.01); *C22C 9/00* (2013.01); *C22C 32/0089* (2013.01); *C23C 14/3414* (2013.01); *C23C 14/35* (2013.01); *H01L 31/0322* (2013.01); *C23C 14/3407* (2013.01); *B22F 2003/145* (2013.01); *Y02E 10/541* (2013.01)
USPC ............. 148/432; 420/489; 420/500; 75/247

(58) Field of Classification Search
None
See application file for complete search history.

(56) References Cited

U.S. PATENT DOCUMENTS

| | | | |
|---|---|---|---|
| 5,626,688 A | 5/1997 | Probst et al. | |
| 8,105,467 B2* | 1/2012 | Zhang et al. | 204/192.13 |
| 8,268,141 B2* | 9/2012 | Zhang et al. | 204/298.13 |
| 8,466,077 B2* | 6/2013 | Zhang et al. | 501/103 |
| 8,795,489 B2* | 8/2014 | Zhang et al. | 204/298.13 |
| 2006/0137773 A1* | 6/2006 | Aruga et al. | 148/432 |
| 2007/0163383 A1* | 7/2007 | Van Duren et al. | 75/255 |
| 2009/0084473 A1* | 4/2009 | Aruga et al. | 148/554 |
| 2011/0223056 A1* | 9/2011 | Aruga et al. | 420/471 |
| 2012/0286219 A1* | 11/2012 | Ikisawa et al. | 252/514 |

FOREIGN PATENT DOCUMENTS

| | | |
|---|---|---|
| EP | 2284906 A1 | 2/2011 |
| JP | 10-074967 A | 3/1998 |
| JP | 2003-197941 A | 7/2003 |
| JP | 2007-266626 A | 10/2007 |
| JP | 2008-138232 A | 6/2008 |
| JP | 2009283560 A | 12/2009 |
| TW | 200932679 A | 8/2009 |

OTHER PUBLICATIONS

T. Tanaka et al., "Preparation of Cu(In,Ga)2Se3.5 thin films by radio frequency sputtering from stoichiometric Cu(In, Ga)Se2 and Na2Se mixture target", J. Appl. Phys., 81(11), pp. 7619-7622 (1997).
International Search Report of corresponding PCT/JP2011/001352, mailed Apr. 5, 2011.
Extended European Search Report dated Jan. 7, 2014 for corresponding European Application No. 11755850.2.
Notice of Refusal for TW Appln. No. 100108559 dated Sep. 30, 2014.

* cited by examiner

*Primary Examiner* — Kiley Stoner
(74) *Attorney, Agent, or Firm* — Edwards Wildman Palmer LLP; Jeffrey D. Hsi

(57) ABSTRACT

[Problems to be Solved]
To provide a sputtering target that is capable of forming a Cu—Ga film to which Na is favorably added by a sputtering method, and a method for producing the same.
[Means to Solve the Problems]
The sputtering target is provided wherein 20 to 40 at % of Ga, 0.05 to 2 at % of Na, and 0.025 to 1.0 at % of S are contained and a remaining portion has a component composition consisting of Cu and unavoidable impurities. Also, a method for producing the sputtering target includes the step of hot pressing a mixed powder of $Na_2S$ powder and Cu—Ga alloy powder or a mixed powder of $Na_2S$ powder, Cu—Ga alloy powder, and pure Cu powder in a vacuum atmosphere or an inert gas atmosphere or sintering a mixed powder of $Na_2S$ powder and Cu—Ga alloy powder or a mixed powder of $Na_2S$ powder, Cu—Ga alloy powder, and pure Cu powder by hot isostatic pressing.

6 Claims, No Drawings

SPUTTERING TARGET AND METHOD FOR PRODUCING SAME

CROSS-REFERENCE TO RELATED APPLICATIONS

This application is the national phase under 35 U.S.C. §371 of PCT International Application No. PCT/JP2011/001352, filed Mar. 8, 2011, which claims the benefit of Japanese Patent Application No. 2010-063214, filed Mar. 18, 2010 and Japanese Patent Application No. 2011-036656, filed Feb. 23, 2011, the entire contents of the aforementioned applications are hereby incorporated herein by reference.

BACKGROUND OF THE INVENTION

1. Field of the Invention

The present invention relates to a sputtering target for use in forming a Cu—In—Ga—Se quaternary alloy film for forming a light absorbing layer of a solar cell, and a method for producing the same.

2. Description of the Related Art

In recent years, thin film solar cells made by using a compound semiconductor have been practically employed. The thin film solar cell made by using the compound semiconductor has a basic structure in which an Mo electrode layer serving as a positive electrode is formed on a sodalime glass substrate, a light absorbing layer consisting of a Cu—In—Ga—Se quaternary alloy film is formed on the Mo electrode layer, a buffer layer consisting of ZnS, CdS, and the like is formed on the light absorbing layer consisting of the Cu—In—Ga—Se quaternary alloy film, and a transparent electrode layer serving as a minus electrode is formed on the buffer layer.

As a method for forming a light absorbing layer consisting of the Cu—In—Ga—Se quaternary alloy film described above, a vapor deposition film-forming method is known. Although a light absorbing layer consisting of a Cu—In—Ga—Se quaternary alloy film, which has been obtained by the method, may exhibit high energy conversion efficiency, the vapor deposition film-forming method attains slow speed for forming a film. Hence, when a large area film is formed, the uniformity of the in-plane distribution of the film thickness may not be ensured. Therefore, a sputtering method for forming a light absorbing layer consisting of a Cu—In—Ga—Se quaternary alloy film has been proposed.

As a sputtering method for forming a Cu—In—Ga—Se quaternary alloy film, a method (so called "selenization method") has been proposed in which a Cu—Ga binary alloy film is firstly formed by sputtering using a Cu—Ga binary alloy sputtering target, an In film is formed on the Cu—Ga film by sputtering using an In sputtering target, and a film stack consisting of the obtained Cu—Ga binary alloy film and In film is subject to heat treatment in a Selenium and Sulfur atmosphere to thereby form a Cu—In—Ga—Se quaternary alloy film (see Patent Documents 1 and 2).

On the other hand, in order to improve the power generation efficiency of a light absorbing layer consisting of a Cu—In—Ga—Se quaternary alloy film, the addition of Na to the light absorbing layer is required. For example, Non-Patent Document 1 proposes the fact that Na content in a precursor film (Cu—In—Ga—Se quaternary alloy film) is typically about 0.1%.

PRIOR ART DOCUMENTS

Patent Documents

[Patent Document 1] Japanese Patent No. 3249408
[Patent Document 2] Japanese Unexamined Patent Publication No. 2009-135299

Non-Patent Document

[Non-Patent Document 1] A. Romeo, "Development of Thin-film Cu(In, Ga)Se2 and CdTe Solar Cells", Prog. Photovolt: Res. Appl. 2004; 12:93-111 (DOI: 10.1002/pip. 527

SUMMARY OF THE INVENTION

Problems to be Solved by the Invention

The following problems still remain in the sputtering target and the method for producing the same for adding Na to the light absorbing layer by the sputtering.

Specifically, the sputtering method is disadvantageous in that the addition of Na to the sputtering target is very difficult. In particular, in the production of solar cells using the selenization method as disclosed in Patent Document 1, a Cu—Ga sputtering target is employed for forming a Cu—Ga film, but Na is not in solid solution with Cu, both the melting point (98° C.) and the boiling point (883° C.) of metal Na are very low, and metal Na is extremely readily oxidized. Therefore, the production of a sputtering target using metal Na has been very difficult.

The present invention has been made in view of the aforementioned circumstances, and an object of the present invention is to provide a sputtering target that is capable of forming a Cu—Ga film to which Na is favorably added by a sputtering method, and a method for producing the same.

Means for Solving the Problems

The present inventors have studied the method for producing a Cu—Ga sputtering target to which Na is favorably added. Consequently, the present inventors have found that Na may be favorably added to a Cu—Ga sputtering target if the compound state of $Na_2S$ powder instead of the metal state of Na is added thereto.

Therefore, the present invention has been made on the basis of the finding, and adopts the following configuration in order to overcome the aforementioned problems. Specifically, the sputtering target of the present invention is characterized in that 20 to 40 at % of Ga, 0.05 to 2 at % of Na, and 0.025 to 1.0 at % of S are contained and a remaining portion has a component composition consisting of Cu and unavoidable impurities.

In the sputtering target, 20 to 40 at % of Ga, 0.05 to 2 at % of Na, and 0.025 to 1.0 at % of S are contained and a remaining portion has a component composition consisting of Cu and unavoidable impurities. Thus, a Cu—Ga film favorably containing Na which is effective for the improvement in power generation efficiency may be formed using the sputtering method. It should be noted that sulfur (S) entrapped in a Cu—Ga film containing Na does not affect the characteristics of the light absorbing layer of a solar cell.

The reason why the amount of sodium (Na) added is set within the range is as follows. If the amount of Na added exceeds 2 at %, the adhesion between a Cu—Ga—Na—S film formed by sputtering and an Mo electrode significantly weakens, resulting in the occurrence of film separations during a selenization process. On the other hand, if the amount of Na added is less than 0.05 at %, the amount of Na in a film is in short, and thus, the effect of improving power generation efficiency may not be obtained. It should be noted that the Na content in the Cu—Ga sputtering target is preferably in the range of 0.1 at % to 0.5 at %.

Also, the reason why the amount of sulfur (S) added is set within the range is as follows. If the amount of S added exceeds 1.0 at %, p-n junction quality in a solar cell deteriorates due to the presence of sulfur, resulting in failure to achieve a high FF (fill factor) for a solar cell. On the other hand, if the amount of S added is less than 0.025 at %, a S defect in Na occurs, and thus, oxygen is incorporated into a S site, resulting in a binding to Na. Consequently, the oxygen content in a sputtering target abnormally increases, and thus, the oxygen content in a precursor film created by sputtering abnormally increases, resulting in a reduction in the conversion efficiency of a solar cell.

Also, the sputtering target of the present invention is characterized in that the sputtering target has a structure in which $Na_2S$ phase is dispersed in a metal phase matrix consisting of Cu and Ga and the average particle diameter of the $Na_2S$ phase is 5 μm or less.

If direct-current sputtering is applied to the Cu—Ga sputtering target, in which a compound state of $Na_2S$ is added, as in the conventional Cu—Ga sputtering target, abnormal discharge due to $Na_2S$ may easily occur. The light absorbing layer of a solar cell is very thick (e.g., 1000 nm to 2000 nm), and thus, the Cu—Ga film is very thick. Consequently, if direct-current sputtering suitable for high-speed film formation cannot be performed due to abnormal discharge, it becomes realistically difficult to achieve mass production of solar cells. In order to suppress such abnormal discharge, the sputtering target of the present invention enables direct-current sputtering to be performed as in the conventional Cu—Ga sputtering target by optimizing the particle size of $Na_2S$ in the sputtering target matrix.

Specifically, in the sputtering target of the present invention, the sputtering target has a structure in which $Na_2S$ phase is dispersed in a metal phase matrix consisting of Cu and Ga and the average particle diameter of the $Na_2S$ phase is 5 μm or less, whereby abnormal discharge due to $Na_2S$ may be suppressed, and thus, stable direct-current sputtering becomes possible. Since the contained $Na_2S$ phase is an insulator material, abnormal discharge often occurs if the average particle diameter of the $Na_2S$ phase exceeds 5 μm, resulting in unstable direct-current sputtering. Therefore, in the present invention, stable direct-current sputtering becomes possible by setting the average particle diameter of the $Na_2S$ phase to be 5 μm or less.

It should be noted that the number of $Na_2S$ particles having a large particle diameter of 10 μm to 40 μm in the field of view of about 0.1 $mm^2$ is preferably three or less when the cross-section of the sputtering target is observed using an electron-probe micro analyzer (hereinafter referred to as "EPMA").

The method for producing a sputtering target of the present invention is a method for producing the sputtering target of the present invention and is characterized in that the method includes a step of hot pressing a mixed powder of $Na_2S$ powder and Cu—Ga alloy powder or a mixed powder of $Na_2S$ powder, Cu—Ga alloy powder, and pure Cu powder in a vacuum atmosphere or an inert gas atmosphere.

Specifically, in the method for producing a sputtering target, the mixed powder is subject to hot pressing in a vacuum atmosphere or an inert gas atmosphere, and thus, a sputtering target in which $Na_2S$ is dispersed and distributed in a uniform manner may be obtained.

Furthermore, the sputtering target of the composition produced by a melting method has low mechanical strength because of segregation of $Na_2S$ in a grain boundary, and thus, is susceptible to cracking during machine processing. On the other hand, in the sputtering target of the present invention produced by the hot pressing method, $Na_2S$ is present in a metal phase matrix consisting of Cu and Ga without affecting the strength of the sputtering target, and thus, stable film formation can be performed without the occurrence of cracking in any step of sintering, machine processing, or sputtering.

Also, the method for producing a sputtering target of the present invention is characterized in that, when the hot pressing method is employed, sintering is performed at a temperature of 500° C. to 800° C.

Specifically, in the method for producing a sputtering target, when the hot pressing method is employed, sintering is performed at a temperature of 500° C. to 800° C., and thus, a sputtering target having higher resistance to cracking during sputtering may be obtained with little occurrence of abnormal discharge during sputtering.

The reason why a retention temperature during hot pressing is set within the range described above is as follows. If the retention temperature during hot pressing is less than 500° C., the density of the sputtering target becomes insufficient, and thus, abnormal discharge often occurs during sputtering of the sputtering target. On the other hand, if the retention temperature during hot pressing exceeds 800° C., $Na_2S$ is moved and agglomerated to the grain boundary of Cu—Ga or Cu particles, resulting in a reduction in the strength of a sintered body. Consequently, cracking may easily occur during machine processing or during sputtering. It should be noted that the retention temperature during hot pressing is preferably within the range of 600° C. to 750° C.

The method for producing a sputtering target of the present invention is a method for producing the sputtering target of the present invention and is characterized in that the method includes a step of sintering a mixed powder of $Na_2S$ powder and Cu—Ga alloy powder or a mixed powder of $Na_2S$ powder, Cu—Ga alloy powder, and pure Cu powder by hot isostatic pressing.

Specifically, in the method for producing a sputtering target, the mixed powder is sintered by hot isostatic pressing, and thus, a sputtering target in which $Na_2S$ is dispersed and distributed in a uniform manner may be obtained.

Furthermore, the sputtering target of the composition produced by a melting method has low mechanical strength because of segregation of $Na_2S$ in a grain boundary, and thus, is susceptible to cracking during machine processing. On the other hand, in the sputtering target of the present invention produced by the hot isostatic pressing, $Na_2S$ is present in a metal phase matrix consisting of Cu and Ga without affecting the strength of the sputtering target, and thus, stable film formation can be performed without the occurrence of cracking in any step of sintering, machine processing, or sputtering.

Also, the method for producing a sputtering target of the present invention is characterized in that, when the hot isostatic pressing is employed, sintering is performed at a temperature of 500° C. to 800° C. and at a pressure of 300 $kgf/cm^2$ or greater.

The reason why a temperature and a pressure during hot isostatic pressing is set within the range described above is as follows. If the temperature is less than 500° C. or the pressure is less than 300 $kgf/cm^2$, the density of the sputtering target becomes insufficient, and thus, abnormal discharge often occurs during sputtering of the sputtering target. On the other hand, if the temperature exceeds 800° C., $Na_2S$ is moved and agglomerated to the grain boundary of Cu—Ga or Cu particles, resulting in a reduction in the strength of a sintered body. Consequently, cracking or chipping may easily occur upon machine processing or during sputtering. It should be noted that the temperature is preferably within the range of 550° C. to 700° C. In view of the performance of an apparatus, the pressure is preferably 1500 $kgf/cm^2$ or less.

Effects of the Invention

According to the present invention, the following effects may be provided.

Specifically, according to the sputtering target of the present invention and a method for producing the same, 20 to 40 at % of Ga, 0.05 to 2 at % of Na, and 0.025 to 1.0 at % of S are contained and a remaining portion has a component composition consisting of Cu and unavoidable impurities. Thus, a Cu—Ga film containing Na which is effective for the improvement in power generation efficiency may be formed using the sputtering method. Therefore, the sputtering target of the present invention can be employed so as to produce a solar cell exhibiting high power generation efficiency because Na may favorably be added into a Cu—Ga film using the sputtering method.

DESCRIPTION OF THE EMBODIMENTS

Hereinafter, a description will be given of one embodiment of the sputtering target of the present invention and a method for producing the same.

In the sputtering target of the present embodiment, 20 to 40 at % of Ga, 0.05 to 2 at % of Na, and 0.025 to 1.0 at % of S are contained and a remaining portion has a component composition consisting of Cu and unavoidable impurities.

Also, the sputtering target of the present embodiment has a structure in which $Na_2S$ phase is dispersed in a metal phase matrix consisting of Cu and Ga and the average particle diameter of the $Na_2S$ phase is 5 µm or less.

The number of $Na_2S$ particles having a large particle diameter of 40 µm to 10 µm in the field of view of 0.1 mm$^2$ is preferably three or less when the cross-section of the target is observed using an EPMA.

The method for producing the sputtering target of the present embodiment includes a step of hot pressing a mixed powder of $Na_2S$ powder and Cu—Ga alloy powder or a mixed powder of $Na_2S$ powder, Cu—Ga alloy powder, and pure Cu powder in a vacuum atmosphere or an inert gas atmosphere.

It should be noted that during the hot pressing, sintering is performed at a retention temperature during hot pressing in the range of 500° C. to 800° C.

Raw material powder to be subject to hot pressing may be produced by any one of the following methods (1) to (3).

(1) $Na_2S$ powder having a purity of 3N or greater and a primary particle diameter of 0.3 µm or less is prepared. $Na_2S$ powder is finely dispersed with a mean secondary particle diameter of 5 µm or less using a pulverizing device (e.g., ball mill, jet mill, Henshell mixer, attritor, or the like). Furthermore, the resulting finely-dispersed powder is blended with Cu—Ga alloy powder so as to conform to a sputtering target composition and the resulting mixture is mixed and dispersed using a mixing device (e.g., ball mill, Henshell mill, jet mill, V-shaped mixer, or the like) to thereby prepare raw material powder for hot pressing. Since $Na_2S$ is water-soluble, a dry-type mixing and pulverizing device without using water is preferably employed instead of a wet-type mixing and pulverizing device with water.

(2) $Na_2S$ powder having a purity of 3N or greater and a primary particle diameter of 0.3 µm or less is prepared. $Na_2S$ powder is blended with Cu—Ga alloy powder so as to conform to a sputtering target composition and both $Na_2S$ powder and Cu—Ga alloy powder are simultaneously filled in a pulverizing device (e.g., ball mill, jet mill, Henshell mixer, attritor, V-shaped mixer, or the like), mixing and pulverizing $Na_2S$ powder are simultaneously performed until the mean secondary particle diameter of $Na_2S$ powder becomes 5 µm or less to thereby prepare raw material powder for hot pressing.

(3) Cu—Ga alloy powder is prepared such that the content of Ga is greater than that of Ga in the pre-prepared sputtering target composition. Firstly, Cu—Ga alloy powder is mixed with $Na_2S$ powder. Furthermore, Cu—Ga alloy powder (or pure Cu powder) having the Ga content less than that of the pre-prepared Cu—Ga alloy powder is added so as to conform to a sputtering target composition and the resulting mixture is mixed in uniform manner to thereby prepare raw material powder for hot pressing.

Next, raw material powder for hot pressing that is prepared by any one of the methods (1) to (3) is stored in a dry environment. This is for the purpose of preventing water moisture absorption due to the presence of $Na_2S$ or aggregation of $Na_2S$ particles due to moisture absorption.

Also, in order to prevent oxidization of a Cu—Ga alloy or Cu, hot pressing is carried out in a vacuum atmosphere or an inert gas atmosphere. The pressure applied during hot pressing may greatly affect the density of the sputtering target sintered body, and thus, the pressure to be applied is preferably in the range of 100 kgf/cm$^2$ to 500 kgf/cm$^2$. Also, pressurization may be performed prior to the start of the elevation of temperature for sintering or may be applied after a certain temperature is reached.

Next, the Cu—Ga—$Na_2S$ sintered body sintered by the hot pressing method described above is processed into a specified shape of a sputtering target using regular discharge processing, cutting, or grinding processing.

Next, the processed sputtering target is bonded to a backing plate consisting of Cu or Cu alloy using In as a solder, and the resulting target is provided to sputtering.

In order to prevent oxidization and moisture absorption of the processed sputtering target, the entire sputtering target is preferably stored in a vacuum pack or a pack purged with inert gas.

The thus produced Cu—Ga—Na—S sputtering target is subject to sputtering by means of a direct-current (DC) magnetron sputtering method in Ar gas. For the direct-current sputtering, a pulse superimposing power supply for applying a pulse voltage or a non-pulse DC power supply may also be employed. An applied power density during sputtering is preferably in the range of from 1 W/cm$^2$ to 10 W/cm$^2$. The thickness of the film formed by the Cu—Ga—Na—S sputtering target is in the range of from 200 nm to 2,000 nm.

In the sputtering target of the present embodiment, since 20 to 40 at % of Ga, 0.05 to 2 at % of Na, and 0.025 to 1.0 at % of S are contained and a remaining portion has a component composition consisting of Cu and unavoidable impurities, a Cu—Ga film favorably containing Na which is effective for the improvement in power generation efficiency may be formed using the sputtering method.

Also, the sputtering target has a structure in which $Na_2S$ phase is dispersed in a metal phase matrix consisting of Cu and Ga and the average particle diameter of the $Na_2S$ phase is 5 µm or less, and thus, stable direct-current sputtering becomes possible by suppressing abnormal discharge caused by $Na_2S$.

Also, in the method for producing the sputtering target of the present embodiment, the mixed powder is subject to hot pressing in a vacuum atmosphere or an inert gas atmosphere, and thus, a sputtering target in which $Na_2S$ is dispersed and distributed in a uniform manner may be produced.

While, in the embodiment, a sputtering target is produced by hot pressing in a vacuum atmosphere or an inert gas atmosphere, the present invention is not limited thereto. A sputtering target may also be produced by hot isostatic pressing.

Specifically, the method for producing a sputtering target according to another embodiment of the present invention includes a step of sintering a mixed powder of $Na_2S$ powder and Cu—Ga alloy powder or a mixed powder of $Na_2S$ powder, Cu—Ga alloy powder, and pure Cu powder by hot isostatic pressing.

During the hot isostatic pressing, sintering is performed at a temperature of 500° C. to 800° C. and a pressure of 300 kgf/cm$^2$ or greater. In order to prevent oxidization of a Cu—Ga alloy or Cu, hot isostatic pressing is carried out in a vacuum atmosphere or an inert gas atmosphere. Also, pressurization may be performed prior to the start of the elevation of temperature for sintering or may be applied after a certain temperature is reached.

It should be noted that the raw material powder may be produced and stored in the similar manner as in the hot pressing described above and a Cu—Ga—$Na_2S$ sintered body sintered by hot isostatic pressing may also be processed in the similar manner as in the hot pressing described above.

In the method for producing the sputtering target according to another embodiment, the mixed powder is sintered by hot isostatic pressing, and thus, a sputtering target in which $Na_2S$ is dispersed and distributed in a uniform manner may be produced.

Examples

Next, the sputtering target of the present invention and a method for producing the same will be specifically described with reference to the evaluation result of the actually produced sputtering target by way of Examples, based on the aforementioned embodiment.

Examples

Firstly, Cu—Ga alloy powder and pure Cu powder (purity 4 N and average particle diameter of 5 μm) having the component composition and the particle diameter shown in Table 1 and $Na_2S$ powder having a purity of 3N and a primary mean particle diameter of 0.2 μm as shown in Table 1 were prepared.

Each of these raw materials consisting of combinations in Examples 1 to 10 shown in Table 1 was placed in a polyethylene pot having a volume of 10 L, $ZrO_2$ ball having φ of 5 mm was further added in the pot, and the resulting mixture was mixed in a ball mill over a period of specified time. The obtained mixed powder was sintered under the sintering condition as specified in Table 2. In the case of hot pressing, the obtained mixed powder was sintered by vacuum hot pressing using a graphite mold and was further grinded to thereby produce sputtering targets (Examples 1 to 10) having the size of φ125 (mm)×5 (mm) T.

It should be noted that the Cu—Ga alloy powder was made by a gas atomization method and was obtained by classification.

Also, in the case of hot isostatic pressing (HIP) (Examples 11 to 13), mixed powder was firstly filled in a metal mold, and was pressure-molded at normal temperatures at a pressure of 1500 kgf/$cm^2$. The obtained molded article was put into a stainless container having a thickness of 0.5 mm, and was subject to vacuum deaeration to thereby be provided to hot isostatic pressing (HIP).

TABLE 1

| EXAMPLES | Cu—Ga ALLOY POWDER | | | PURE Cu POWDER AMOUNT ADDED (g) | $Na_2S$ POWDER AMOUNT ADDED (g) | MIXING TIME hour |
|---|---|---|---|---|---|---|
| | AVERAGE PARTICLE DIAMETER (μm) | COMPOSITION (at %) (Ga/Ga + Cu) | AMOUNT ADDED (g) | | | |
| 1 | 10 | 20 | 6470 | 0 | 2.3 | 8 |
| 2 | 60 | 20 | 6380 | 0 | 39.0 | 20 |
| 3 | 50 | 40 | 6590 | 0 | 4.0 | 10 |
| 4 | 25 | 40 | 6550 | 0 | 20.0 | 15 |
| 5 | 100 | 30 | 6530 | 0 | 4.0 | 15 |
| 6 | 150 | 30 | 6490 | 0 | 20.0 | 10 |
| 7 | 120 | 30 | 6445 | 0 | 39.0 | 24 |
| 8 | 10 | 30 | 6260 | 0 | 78.0 | 24 |
| 9 | 30 | 48 | 4200 | 2300 | 39.0 | 20 |
| 10 | 100 | 48 | 4200 | 2300 | 20.0 | 10 |
| 11 | 10 | 20 | 6470 | 0 | 2.3 | 8 |
| 12 | 10 | 30 | 6260 | 0 | 78.0 | 24 |
| 13 | 30 | 48 | 4200 | 2300 | 39.0 | 20 |

TABLE 2

| EXAMPLES | RETENTION TEMPERATURE DURING HOT PRESSING OR HIP | PRESSURE (kgf/$cm^2$) DURING HOT PRESSING OR HIP | TIME (HOUR) DURING HOT PRESSING OR HIP |
|---|---|---|---|
| 1 | 800 | 150 | 3 |
| 2 | 800 | 150 | 3 |
| 3 | 550 | 500 | 4 |
| 4 | 550 | 500 | 4 |
| 5 | 700 | 200 | 1 |
| 6 | 700 | 200 | 1 |
| 7 | 600 | 300 | 2 |
| 8 | 600 | 300 | 2 |
| 9 | 750 | 350 | 2 |
| 10 | 750 | 350 | 2 |
| 11 | 650 | 1000 | 1.5 |
| 12 | 700 | 700 | 1 |
| 13 | 650 | 1000 | 1 |

Evaluation

In the present Examples 1 to 13, the sputtering targets that have been subject to grinding were visually observed for the presence/absence of chipping and cracking, and the structure of each of the obtained sintered bodies was observed using an EPMA (JXA-8500F manufactured by Nihon Densi Corporation).

Also, when the structure was observed at magnification of 500×, the size of the observable $Na_2S$ particles (0.5 μm or greater) was measured to thereby calculate the average particle diameter using the following method.
(a) Ten COMPO images (observation range of 60 μm×80 μm) with a magnification of 500× are taken using the EPMA.
(b) The taken images are converted into monochrome images using commercially available image analysis software and are subject to binarization using a single threshold value. With this arrangement, $Na_2S$ particles will be displayed in black.

Examples of such image analysis software include Win-Roof Ver 5.6.2 (manufactured by Mitani Shoji Co., Ltd.) or the like. Also, the term "binarization" refers to the fact that a certain "threshold value" is set to the luminance (brightness) for each pixel of an image so as to distinguish an area such that "0" is given to each pixel if the luminance is equal to or lower than a threshold value and "1" is given to each pixel if the luminance is greater than a threshold value.

(c) The maximum threshold value for not selecting the entire image is set to 100%, and the threshold value of 32% is employed to thereby select an area displayed in black indicating $Na_2S$ particles.

Then, the selected area is contracted four times and expanded three times. The resulting area is intended to be $Na_2S$ particles so as to measure the size of each individual particle to thereby calculate the average particle diameter.

An example of magnification used for area contraction and expansion is 2.3%.

Also, quantitative analysis for Ga content and Na content in the produced Cu—Ga—Na—S sputtering target was carried out simultaneously using an ICP method (high frequency induction coupled plasma method). Note that sulfur (S) was analyzed using a carbon/sulfur analysis device (HORIBA, Ltd.).

Furthermore, the sputtering target film having the thickness of 1000 nm was formed on a blue glass plate having the thickness of 3.2 mm, on which was coated with a Mo sputtering film, by means of direct-current sputtering with a power density of 5 W/cm$^2$ using a magnetron sputtering device. It should be noted that the thickness of the Mo sputtering film was 500 nm.

The Ar pressure during sputtering was 1.3 Pa and the distance between the sputtering target and the substrate was 70 mm. Note that the substrate heating during film formation was not performed. Furthermore, the number of times that abnormal discharge occurred during continuous sputtering for ten minutes under the aforementioned conditions was automatically recorded using an arcing counter attached to a sputtering power supply.

Such sputtering was repeated five times. Then, the surface of each sputtering target was observed for the presence/absence of chipping and cracking occurred during sputtering and the total number of times abnormal discharge occurred during five-times sputtering. The results are shown in Table 3.

Also, the Na, S, and Ga content were measured at five locations of each sputtered film using the EPMA.

TABLE 4

| EXAMPLES | RESULT OF ANALYSIS OF ELEMENTAL CONTENT IN FILM (at %) | | |
|---|---|---|---|
| | Ga | Na | S |
| 1 | 22 | 0.1 | 0.0 |
| 2 | 21 | 0.9 | 0.4 |
| 3 | 43 | 0.1 | 0.0 |
| 4 | 43 | 0.5 | 0.3 |
| 5 | 32 | 0.1 | 0.0 |
| 6 | 31 | 0.5 | 0.2 |
| 7 | 33 | 1.1 | 0.4 |
| 8 | 31 | 1.8 | 1.0 |
| 9 | 32 | 1.0 | 0.3 |
| 10 | 33 | 0.6 | 0.2 |
| 11 | 20 | 0.1 | 0.0 |
| 12 | 32 | 2.0 | 0.8 |
| 13 | 29 | 0.9 | 0.2 |

Comparative Examples

Cu—Ga alloy powder and pure Cu powder having the component composition and the particle diameter shown in Table 5 were prepared and $Na_2S$ powder similar to that in Table 1 was further prepared. These raw materials were mixed in a ball mill for a period of the specified time in a similar manner as those of Examples shown in Table 1. The resulting mixture was sintered by hot pressing, HIP, or a melting/casting method under the conditions shown in Table 6. In the formulation of each of the thus obtained sputtering targets in Comparative Examples, the Na content falls outside the range of from 0.05 at % to 2 at %.

As shown in Table 6, in Comparative Examples 8 and 10 shown in Table 5, the mixed powder was not produced by a hot pressing method or an HIP method but was melted in a graphite crucible using a vacuum melting furnace at 1000° C., and was cast into an iron mold. After cooling, the resulting powder was subject to machine processing.

TABLE 3

| EXAMPLES | CHIPPING OR CRACKING AFTER PROCESSING | RESULT OF ANALYSIS OF ELEMENTAL CONTENT IN TARGET (at %) | | | AVERAGE PARTICLE DIAMETER OF $Na_2S$ IN TARGET (μm) | TARGET CRACKING AFTER SPUTTERING | THE NUMBER OF ABNORMAL DISCHARGE DURING SPUTTERING |
|---|---|---|---|---|---|---|---|
| | | Ga | Na | S | | | |
| 1 | NONE | 20 | 0.1 | 0.03 | 3.2 | NONE | 0 |
| 2 | NONE | 20 | 1.0 | 0.5 | 2.2 | NONE | 1 |
| 3 | NONE | 40 | 0.1 | 0.05 | 3.4 | NONE | 0 |
| 4 | NONE | 40 | 0.5 | 0.3 | 3.1 | NONE | 0 |
| 5 | NONE | 30 | 0.1 | 0.05 | 2.4 | NONE | 0 |
| 6 | NONE | 30 | 0.5 | 0.2 | 1.7 | NONE | 1 |
| 7 | NONE | 30 | 1.0 | 0.5 | 4.0 | NONE | 0 |
| 8 | NONE | 30 | 2.0 | 1 | 4.9 | NONE | 2 |
| 9 | NONE | 30 | 1.0 | 0.5 | 1.9 | NONE | 0 |
| 10 | NONE | 30 | 0.5 | 0.3 | 3.1 | NONE | 0 |
| 11 | NONE | 20 | 0.1 | 0.04 | 3.1 | NONE | 0 |
| 12 | NONE | 30 | 2.0 | 0.9 | 4.6 | NONE | 1 |
| 13 | NONE | 30 | 1.1 | 0.6 | 2.0 | NONE | 0 |

TABLE 5

| COMPARATIVE EXAMPLES | Cu—Ga ALLOY POWDER | | | PURE Cu POWDER AMOUNT ADDED (g) | Na₂S POWDER AMOUNT ADDED (g) | MIXING TIME hour |
|---|---|---|---|---|---|---|
| | AVERAGE PARTICLE DIAMETER (μm) | COMPOSITION (at %) (Ga/Ga + Cu) | AMOUNT ADDED (g) | | | |
| 1 | 40 | 20 | 6470 | 0 | 1.6 | 8.0 |
| 2 | 60 | 20 | 6380 | 0 | 120.0 | 20.0 |
| 3 | 50 | 40 | 6590 | 0 | 0.4 | 10.0 |
| 4 | 25 | 40 | 6550 | 0 | 160.0 | 30.0 |
| 5 | 100 | 30 | 6530 | 0 | 0.0 | 15.0 |
| 6 | 150 | 30 | 6490 | 0 | 1.6 | 10.0 |
| 7 | 120 | 30 | 6445 | 0 | 110.0 | 3.0 |
| 8 | Cu: 4257 g, Ga: 2005 g, Na₂S: 80 g | | | | | |
| 9 | 30 | 48 | 4200 | 2300 | 1.6 | 20.0 |
| 10 | Cu: 4420 g, Ga: 2080 g, Na₂S: 90 g | | | | | |
| 11 | 40 | 20 | 6470 | 0 | 1.6 | 8.0 |
| 12 | 60 | 32 | 6500 | 0 | 90.0 | 3.0 |

TABLE 6

| COMPARATIVE EXAMPLES | RETENTION TEMPERATURE DURING HOT PRESSING OR HIP | PRESSURE (kgf/cm²) DURING HOT PRESSING OR HIP | TIME (HOUR) DURING HOT PRESSING OR HIP |
|---|---|---|---|
| 1 | 800 | 150 | 3 |
| 2 | 950 | 150 | 3 |
| 3 | 550 | 500 | 4 |
| 4 | 350 | 500 | 4 |
| 5 | 700 | 200 | 1 |
| 6 | 700 | 200 | 1 |
| 7 | 700 | 300 | 2 |
| 8 | MELTING METHOD | | |
| 9 | 750 | 350 | 2 |
| 10 | MELTING METHOD | | |
| 11 | 400 | 250 | 2 |
| 12 | 450 | 200 | 5 |

TABLE 8

| COMPARATIVE EXAMPLES | RESULT OF ANALYSIS OF ELEMENTAL CONTENT IN FILM (at %) | | |
|---|---|---|---|
| | Ga | Na | S |
| 1 | 21 | 0.0 | 0.0 |
| 2 | 22 | 3.0 | 1.1 |
| 3 | 43 | 0.0 | 0.0 |
| 4 | 44 | 4.0 | 2.0 |
| 5 | 32 | 0.0 | 0.0 |
| 6 | 32 | 0.0 | 0.0 |
| 7 | 31 | 3.0 | 1.5 |
| 8 | FILM COULD NOT BE FORMED | | |
| 9 | 32 | 1.0 | 0.3 |
| 10 | 33 | 0.6 | 0.2 |
| 11 | FILM COULD NOT BE FORMED | | |
| 12 | FILM COULD NOT BE FORMED | | |

The evaluation of Comparative Examples was performed in a similar manner as that of Examples. The evaluation results are shown in Table 7 and Table 8.

As can be seen from the evaluation results, in the present Example, both cracking during machine processing and cracking during sputtering did not occur as shown in Table 3. On the other hand, as shown in Table 7, cracking or chipping occurred during machine processing in Comparative

TABLE 7

| COMPARATIVE EXAMPLES | CHIPPING OR CRACKING AFTER PROCESSING | RESULT OF ANALYSIS OF ELEMENTAL CONTENT IN TARGET (at %) | | | AVERAGE PARTICLE DIAMETER OF Na₂S IN TARGET (μm) | TARGET CRACKING AFTER SPUTTERING | THE NUMBER OF ABNORMAL DISCHARGE DURING SPUTTERING |
|---|---|---|---|---|---|---|---|
| | | Ga | Na | S | | | |
| 1 | NONE | 20 | 0.0 | 0.0 | 2.1 | NONE | 1 |
| 2 | NONE | 20 | 2.8 | 1.3 | 4.0 | CRACKING | 3200 |
| 3 | NONE | 40 | 0.0 | 0.0 | 3.2 | NONE | 2 |
| 4 | NONE | 40 | 4.2 | 1.7 | 3.3 | CRACKING | 16000 |
| 5 | NONE | 30 | 0.0 | 0.0 | NONE | NONE | 0 |
| 6 | NONE | 30 | 0.0 | 0.0 | 1.9 | NONE | 1 |
| 7 | NONE | 30 | 3.0 | 1.2 | 16.0 | CRACKING | 5000 |
| 8 | CRACKING | 30 | 2.1 | 1.0 | WAS NOT BE MEASURED | TARGET COULD NOT BE OBTAINED | COULD NOT BE MEASURED |
| 9 | NONE | 30 | 0.0 | 0.0 | 2.0 | NONE | 0 |
| 10 | CHIPPING | 30 | 2.3 | 1.0 | WAS NOT BE MEASURED | CRACKING | 15670 |
| 11 | CRACKING | 19 | 0.0 | 0.0 | COULD NOT BE MEASURED | TARGET COULD NOT BE OBTAINED | COULD NOT BE MEASURED |
| 12 | CRACKING | 30 | 2.4 | 1.0 | COULD NOT BE MEASURED | TARGET COULD NOT BE OBTAINED | COULD NOT BE MEASURED |

Examples 8, 10, 11, and 12. Also, cracking during sputtering occurred in Comparative Examples 2, 4, 7, and 10.

Specifically, it can be seen that, in Comparative Examples 8 and 10 produced by the melting/casting method, cracking occurred during machine processing. In Comparative Examples 11 and 12 in which the HIP temperature was lower than 500° C. and the pressure was lower than 300 kgf/cm$^2$, cracking occurred during machine processing because the mechanical strength of the sintered bodies was low, whereby sputable sputtering targets could not be produced. In any one of Comparative Example 2 in which the Na content was a high 2.8 at % and the retention temperature during hot pressing was as high as 950° C., Comparative Example 7 in which the Na content was a high 3 at % and the average particle diameter of $Na_2S$ was a high 16 μm, and Comparative Example 4 in which the Na content was a high 4.2 at % and the retention temperature during hot pressing was a low 350° C., cracking occurred during sputtering.

In any one of the present Examples, the number of times that abnormal discharge occurred during sputtering was 10 times or less. On the other hand, in Comparative Examples 2, 4, 7, and 10, the number of times that abnormal discharge occurred during sputtering was 1000 times or greater. Specifically, abnormal discharge occurred in many times in Comparative Example 2 in which the Na content was a high 2.8 at % and the retention temperature during hot pressing was as high as 950° C., Comparative Example 7 in which the Na content was a high 3 at % and the average particle diameter of $Na_2S$ was a high 16 μm, Comparative Example 4 in which the Na content was a high 4.2 at % and the retention temperature during hot pressing was as low as 350° C., and Comparative Example 10 in which the Na content was a high 2.3 at % and which was made by a melting method.

Also, in Comparative Examples 1, 3, 5, 6, and 9 in which the Na content is 0.03 at % or less, the Na content in a film is 0.01 at % or less, and thus, there is little Na in the film. In Comparative Examples 8, 11, and 12, cracking occurred during machine processing, and thus, the particle size of $Na_2S$ was not measured.

As described above, according to the sputtering target of in the present invention, since 20 to 40 at % of Ga, 0.05 to 2 at % of Na, and 0.025 to 1.0 at of S are contained and a remaining portion has a component composition consisting of Cu and unavoidable impurities, a Cu—Ga film containing Na which is effective for the improvement in power generation efficiency may be formed using the sputtering method. Therefore, the sputtering target of the present invention can be employed so as to produce a solar cell exhibiting high power generation efficiency, to which Na may favorably be added, using the sputtering method.

The technical scope of the present invention is not limited to the aforementioned embodiments and Examples, but the present invention may be modified in various ways without departing from the scope or teaching of the present invention.

What is claimed is:

1. A sputtering target, wherein 20 to 40 at % of Ga, 0.05 to 2 at % of Na, and 0.025 to 1.0 at % of S are contained and a remaining portion has a component composition consisting of Cu and unavoidable impurities.

2. The sputtering target according to claim 1, wherein the sputtering target has a structure in which $Na_2S$ phase is dispersed in a metal phase matrix consisting of Cu and Ga and the average particle diameter of the $Na_2S$ phase is 5 μm or less.

3. A method for producing the sputtering target according to claim 1, the method comprising the step of:
    hot pressing a mixed powder of $Na_2S$ powder and Cu—Ga alloy powder or a mixed powder of $Na_2S$ powder, Cu—Ga alloy powder, and pure Cu powder in a vacuum atmosphere or an inert gas atmosphere.

4. The method for producing a sputtering target according to claim 3, wherein the hot pressing is performed at a retention temperature during hot pressing of 500° C. to 800° C.

5. A method for producing the sputtering target according to claim 1, the method comprising the step of:
    sintering a mixed powder of $Na_2S$ powder and Cu—Ga alloy powder or a mixed powder of $Na_2S$ powder, Cu—Ga alloy powder, and pure Cu powder by hot isostatic pressing.

6. The method for producing a sputtering target according to claim 5, wherein the hot isostatic pressing is performed at a temperature of 500° C. to 800° C. and at a pressure of 300 kgf/cm$^2$ or greater.

* * * * *